United States Patent
Nojiri et al.

(10) Patent No.: US 9,018,613 B2
(45) Date of Patent: Apr. 28, 2015

(54) SEMICONDUCTOR MEMORY DEVICE WITH A MEMORY CELL BLOCK INCLUDING A BLOCK FILM

(71) Applicants: Yasuhiro Nojiri, Yokohama (JP); Hiroyuki Fukumizu, Yokohama (JP); Shigeki Kobayashi, Kuwana (JP); Masaki Yamato, Yokkaichi (JP)

(72) Inventors: Yasuhiro Nojiri, Yokohama (JP); Hiroyuki Fukumizu, Yokohama (JP); Shigeki Kobayashi, Kuwana (JP); Masaki Yamato, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 108 days.

(21) Appl. No.: 13/730,342

(22) Filed: Dec. 28, 2012

(65) Prior Publication Data
US 2014/0048761 A1 Feb. 20, 2014

Related U.S. Application Data

(60) Provisional application No. 61/682,931, filed on Aug. 14, 2012.

(51) Int. Cl.
*H01L 29/02* (2006.01)
*H01L 45/00* (2006.01)
*H01L 27/24* (2006.01)

(52) U.S. Cl.
CPC .............. *H01L 45/146* (2013.01); *H01L 45/16* (2013.01); *H01L 45/04* (2013.01); *H01L 45/12* (2013.01); *H01L 45/1226* (2013.01); *H01L 45/1616* (2013.01); *H01L 27/2454* (2013.01); *H01L 27/249* (2013.01)

(58) Field of Classification Search
USPC .................. 257/2–5, E29.002; 438/102–104
See application file for complete search history.

(56) References Cited

U.S. PATENT DOCUMENTS

| | | | |
|---|---|---|---|
| 8,575,584 B2* | 11/2013 | Satoh et al. | 257/2 |
| 2003/0096497 A1* | 5/2003 | Moore et al. | 438/652 |
| 2004/0090815 A1* | 5/2004 | Tajiri | 365/148 |
| 2008/0116438 A1* | 5/2008 | Lee et al. | 257/2 |
| 2008/0175032 A1* | 7/2008 | Tanaka et al. | 365/51 |
| 2009/0007037 A1* | 1/2009 | Hsu et al. | 716/5 |
| 2009/0034355 A1* | 2/2009 | Wang | 365/230.01 |
| 2009/0321878 A1 | 12/2009 | Koo et al. | |
| 2010/0072452 A1 | 3/2010 | Kim et al. | |
| 2010/0178729 A1 | 7/2010 | Yoon et al. | |

(Continued)

FOREIGN PATENT DOCUMENTS

| JP | 2008-181978 | 8/2008 |
|---|---|---|
| JP | 2010-10688 | 1/2010 |

(Continued)

*Primary Examiner* — Jami M Valentine
(74) *Attorney, Agent, or Firm* — Oblon, McClelland, Maier & Neustadt, L.L.P.

(57) ABSTRACT

A semiconductor memory device according to an embodiment comprises: a semiconductor substrate; and a memory cell block formed on the semiconductor substrate and configured having a plurality of memory cell arrays, each of the memory cell arrays including a plurality of column lines, a plurality of row lines, and a plurality of memory cells disposed at each of intersections of the plurality of column lines and the plurality of row lines, each of the memory cells including a variable resistance element having a transition metal oxide as a material, at least one of the plurality of column lines and the plurality of row lines being a polysilicon wiring line having polysilicon as a material, and the memory cell block including a block film between the variable resistance element of the memory cell and the polysilicon wiring line.

8 Claims, 17 Drawing Sheets

(56) References Cited

U.S. PATENT DOCUMENTS

| | | | |
|---|---|---|---|
| 2011/0085368 A1* | 4/2011 | Kim et al. | 365/63 |
| 2011/0140068 A1 | 6/2011 | Ozawa et al. | |
| 2013/0056698 A1* | 3/2013 | Satoh et al. | 257/2 |
| 2014/0048761 A1* | 2/2014 | Nojiri et al. | 257/2 |

FOREIGN PATENT DOCUMENTS

| | | |
|---|---|---|
| JP | 2010-74169 | 4/2010 |
| JP | 2010-166047 | 7/2010 |
| JP | 2011-86918 | 4/2011 |
| JP | 2011-129639 | 6/2011 |

* cited by examiner

SEMICONDUCTOR MEMORY DEVICE WITH A MEMORY CELL BLOCK INCLUDING A BLOCK FILM

CROSS-REFERENCE TO RELATED APPLICATION

This application is based upon and claims the benefit of priority from the prior U.S. Provisional Application 61/682,931, filed on Aug. 14, 2012, the entire contents of which are incorporated herein by reference.

BACKGROUND

1. Field

Embodiments of the present invention relate to a semiconductor memory device and a method of manufacturing the same.

2. Description of the Related Art

In recent years, ReRAM (Resistive RAM) is receiving attention as a technology for realizing an even higher level of integration in semiconductor devices.

A memory cell in this ReRAM does not require a selection element such as a MOSFET, hence it is easy to configure a memory cell array having such memory cells disposed three-dimensionally. For example, there is a memory cell array configured from pillar-shaped bit lines extending in a vertical direction with respect to a substrate, pillar-shaped resistance varying material members extending in the vertical direction and formed on side surfaces of these bit lines, and word lines extending in a horizontal direction and intersecting the bit lines via the resistance varying material members (below, this three-dimensionally arranged memory cell array is sometimes referred to as a "memory cell block").

However, in the case of this memory cell array, a resistance varying film configuring the memory cell and a polysilicon film configuring the bit line or the word line sometimes react to form a silicide. In this case, an operating voltage of the memory cell increases, hence a problem occurs in power consumption.

DETAILED DESCRIPTION

A semiconductor memory device according to an embodiment comprises, in the case that three mutually intersecting directions are assumed to be an X direction, a Y direction, and a Z direction: a semiconductor substrate having as principal plane a plane extending in the X direction and the Y direction; and a memory cell block formed on the semiconductor substrate and configured having a plurality of memory cell arrays aligned in the Y direction, each of the memory cell arrays including a plurality of column lines extending in the Z direction and arranged in the X direction, a plurality of row lines extending in the X direction and arranged in the Z direction, and a plurality of memory cells disposed at each of intersections of the plurality of column lines and the plurality of row lines, each of the memory cells including a variable resistance element having a transition metal oxide as a material, at least one of the plurality of column lines and the plurality of row lines being a polysilicon wiring line having polysilicon as a material, and the memory cell block including a block film between the variable resistance element of the memory cell and the polysilicon wiring line.

A semiconductor memory device and a method of manufacturing the same according to embodiments are described below with reference to the accompanying drawings.

First Embodiment

<Overall Structure>

An overall structure of a semiconductor memory device according to a first embodiment is described herein.

Figure 1:
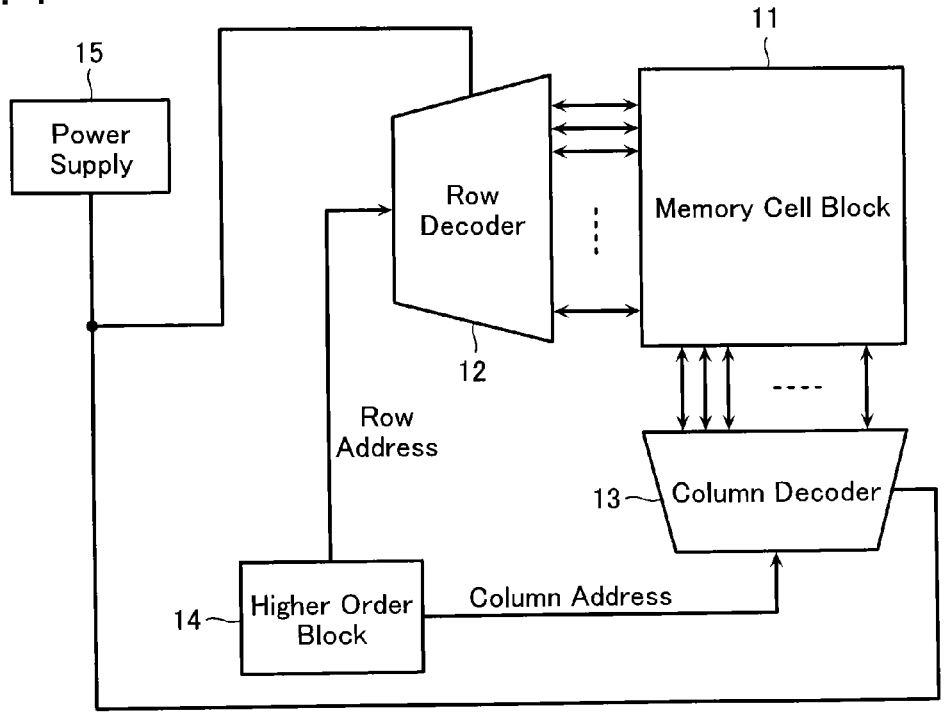
FIG. 1 is a functional block diagram of a semiconductor memory device according to a first embodiment.

FIG. 1 is a functional block diagram of the semiconductor memory device according to the present embodiment.

This semiconductor memory device comprises a memory cell block 11 configured from a plurality of memory cell arrays, each of the memory cell arrays including: a plurality of row lines and column lines that intersect one another; and memory cells provided at each of intersections of these row lines and column lines. In the description below, in conformance with an ordinary semiconductor memory device, the row lines and column lines are sometimes called "word lines" and "bit lines", respectively.

Moreover, this semiconductor memory device comprises a row decoder 12 for selecting the row lines and a column decoder 13 for selecting the column lines during access (data erase/write/read). The column decoder 13 includes a driver for controlling an access operation.

Furthermore, this semiconductor memory device comprises a higher order block 14 for selecting a memory cell which is to be an access target in the memory cell block 11. The higher order block 14 provides a row address and a column address to the row decoder 12 and the column decoder 13, respectively. A power supply 15 generates combinations of certain voltages corresponding to each of operations of data erase/write/read, and supplies these combinations of voltages to the row decoder 12 and the column decoder 13. Note that in the description below, a data erase operation is sometimes called a "resetting operation", and a voltage required in the resetting operation is sometimes called a "resetting voltage". Similarly, a data write operation is sometimes called a "setting operation", and a voltage required in the setting operation is sometimes called a "setting voltage".

The above-described functional blocks enable block data erase/write/read of all the memory cells connected to an identical word line to be performed.

<Overview and Structure of Memory Cell Block>

An overview and structure of the memory cell block in the semiconductor memory device according to the first embodiment are described herein.

First, a circuit of the memory cell block 11 is described.

Figure 2:
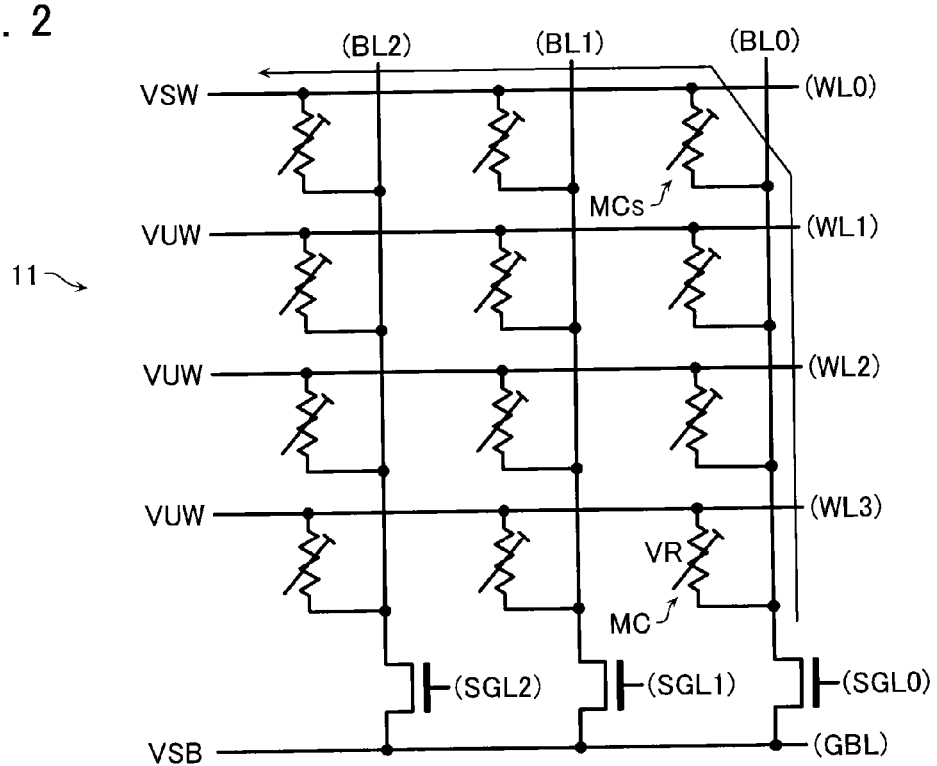
FIG. 2 is a circuit diagram of a memory cell block in the semiconductor memory device according to the same embodiment.

FIG. 2 is a circuit diagram of the memory cell block 11.

As previously mentioned, the memory cell block 11 includes: a plurality of word lines WL and a plurality of bit lines BL that intersect one another; and memory cells MC disposed at each of intersections of these word lines WL and bit lines BL and each configured from a variable resistance element VR. The bit lines BL are each connected to a global bit line GBL (global column line) via a selection element S provided to each of the bit lines BL.

The memory cell block 11 has each of word lines WL0, WL1, . . . connected to the row decoder 12, and each of bit lines BL0, BL1, . . . connected via the global bit line GBL to the column decoder 13. Moreover, voltages supplied from the row decoder 12 and the column decoder 13 cause operation voltages required in various kinds of operations such as the resetting operation to be applied to the memory cells MC.

Regarding access to the memory cells MC, first, the word line WL (WL0 in the case of FIG. 2) and the bit line BL (BL0 in the case of FIG. 2) connected to the selected memory cell MC$_S$ which is to be the access target in the memory cell block 11 are selected by the row decoder 12 and the column decoder 13, based on the row address and the column address outputted from the higher order block 14. Selection of the bit line BL is performed by on/off control of the selection element S via a select gate line SGL.

Next, the row decoder 12 supplies a selected word line voltage VSW to the selected word line WL (WL0 in the case of FIG. 2) and an unselected word line voltage VUW to the other unselected word lines WL. Meanwhile, the column decoder 13 supplies a selected bit line voltage VSB to the selected bit line BL (BL0 in the case of FIG. 2). Setting these selected word line voltage VSW, unselected word line voltage VUW, and selected bit line voltage VSB to appropriate voltages enables appropriate operation voltages to be applied to the memory cells MC.

Next, the structure of the memory cell block 11 is described.

Figure 3:
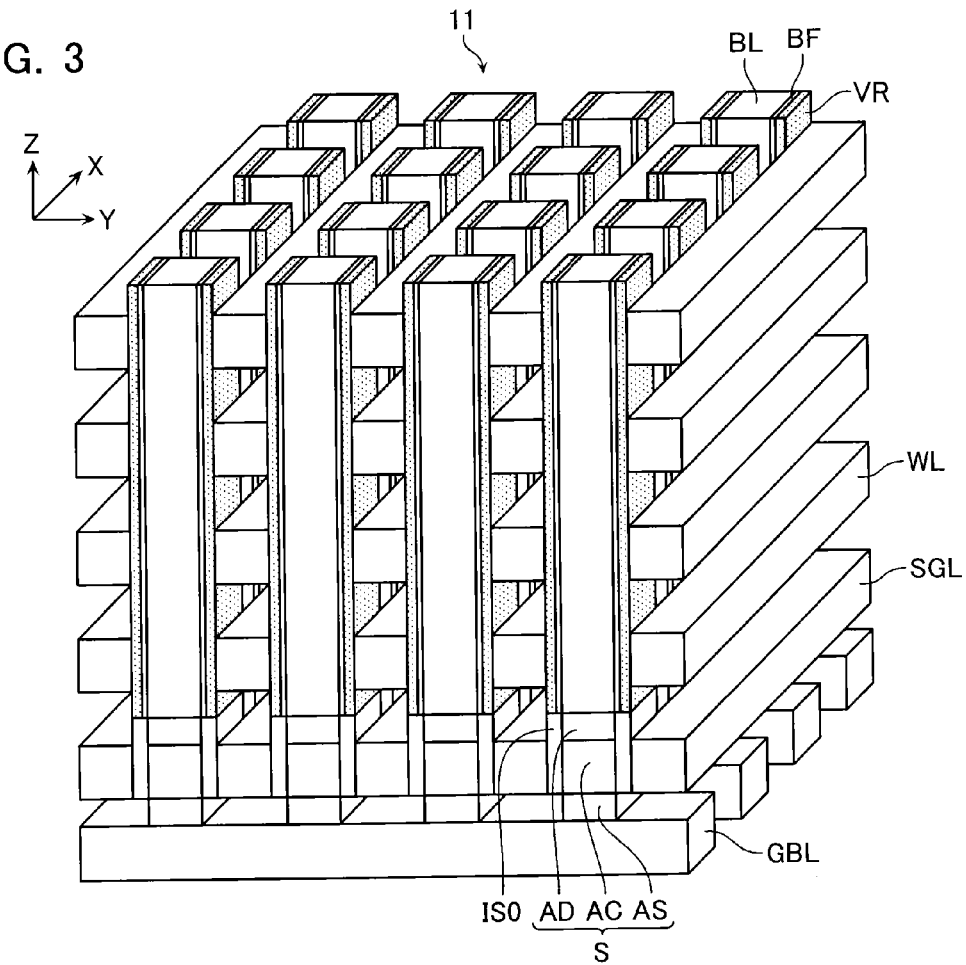
FIG. 3 is a perspective view showing a structure of the memory cell block in the semiconductor memory device according to the same embodiment.
Figure 4:
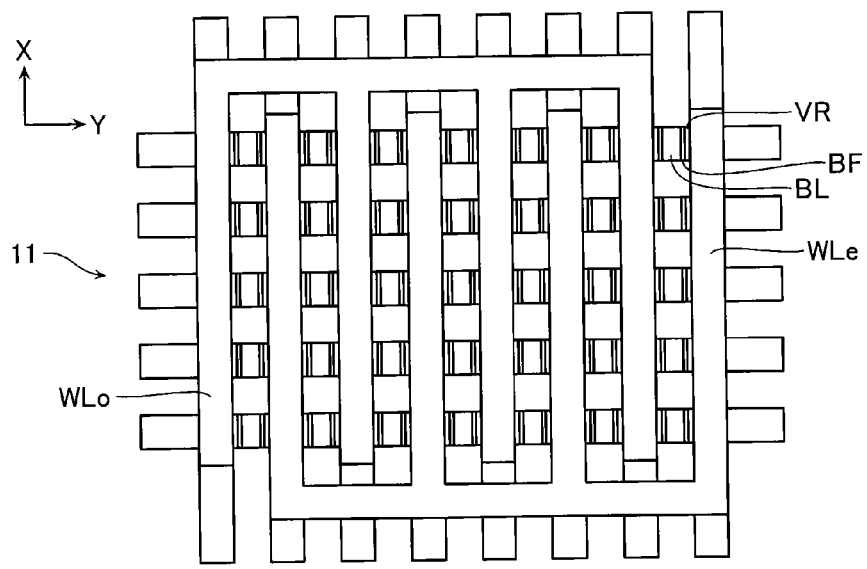
FIG. 4 is an X-Y cross-sectional view showing the structure of the memory cell block in the semiconductor memory device according to the same embodiment.

FIG. 3 is a perspective view showing part of the memory cell block 11, and FIG. 4 is an X-Y cross-sectional view of the memory cell block 11.

The memory cell block 11 includes a plurality of memory cell arrays aligned with a certain pitch in the Y direction. Each of the memory cell arrays includes: a plurality of word lines WL extending in the X direction and arranged with a certain pitch in the Z direction in the X-Z plane; a plurality of bit lines BL extending in the Z direction and arranged with a certain pitch in the X direction in the X-Z plane; and a variable resistance element VR provided at each of intersections of these plurality of word lines WL and plurality of bit lines BL. Two of the memory cell arrays adjacent in the Y direction share the word lines WL or the bit lines BL.

The word lines WL may be formed using a material having high heat resistance and a low resistance value. Suitable materials include, for example, tungsten (W), titanium (Ti), tantalum (Ta), and their nitrides, or materials having these metals and nitrides stacked, and so on. The bit lines are formed having polysilicon as a material. In the present embodiment, the bit lines BL correspond to polysilicon wiring lines.

In addition, the variable resistance element VR is formed using a resistance varying material. The resistance varying material herein is a material that undergoes transition between at least two resistance values of a low-resistance state and a high-resistance state, the resistance varying material in the low-resistance state undergoing transition to the high-resistance state when applied with a certain voltage (setting operation), and the resistance varying material in the high-resistance state undergoing transition to the low-resistance state when applied with a certain current (resetting operation). Employable as the resistance varying material is, for example, a transition metal oxide having as principal component an oxide including at least one element selected from the group consisting of hafnium (Hf), zirconium (Zr), nickel (Ni), tantalum (Ta), tungsten (W), cobalt (Co), aluminum (Al), iron (Fe), manganese (Mn), chromium (Cr), and niobium (Nb). Suitable resistance varying materials include, for example, hafnium oxide ($HfO_2$), aluminum oxide ($Al_2O_3$), titanium oxide ($TiO_2$), nickel oxide (NiO), tungsten oxide ($WO_3$), tantalum oxide ($Ta_2O_5$), and so on. Employing a film formation method of good isotropy typified by atomic layer deposition (ALD) enables these resistance varying materials to be formed with a homogeneous and regular film thickness even on side walls.

In addition, the memory cell block 11 includes a plurality of global bit lines GBL extending in the Y direction and arranged with a certain pitch in the X direction in the X-Y plane. Of the plurality of bit lines BL in the memory cell block 11, those aligned in the Y direction in the Y-Z plane are commonly connected to one of the global bit lines GBL via the selection elements S formed at one ends of each of the bit lines BL. Each of the selection elements S includes a source region AS, a channel region AC, and a drain region AD stacked in the Z direction from the global bit line GBL toward the bit line BL. Moreover, the memory cell block 11 includes a plurality of select gate lines SGL extending in the X direction between the selection elements S adjacent in the Y direction. The plurality of selection elements S aligned in the X direction are commonly on/off controlled by one of the select gate lines SGL via gate insulating films IS0 formed in a side surface facing the Y direction of each of the selection elements S.

Meanwhile, although not illustrated in FIG. 3, of the plurality of word lines WL in the memory cell block 11, fellow even-numbered word lines WLe aligned in the Y direction in the X-Y plane and fellow odd-numbered word lines WLo aligned in the Y direction in the X-Y plane are respectively commonly connected, as shown in FIG. 4.

Furthermore, the memory cell block 11 in the present embodiment includes a block film BF between the bit line BL which has polysilicon as a material and the variable resistance element VR which has a transition metal oxide as a material.

This block film BF is for preventing combination of silicon in the polysilicon and a transition metal in the transition metal oxide, and may be formed having silicon nitride (SiN), silicon oxynitride (SiON), and silicon oxide ($SiO_2$), or the like, as a material.

Note that in FIG. 3 and FIG. 4, regions that are void are actually filled with silicon oxide ($SiO_2$), hence, excluding the above-described relationships of connection, electrical insulation is respectively maintained between each of the wiring lines, that is, the word lines WL, bit lines BL, and global bit lines GBL.

Next, a cross-section of the memory cell block 11 is described a little more.

Figure 5:
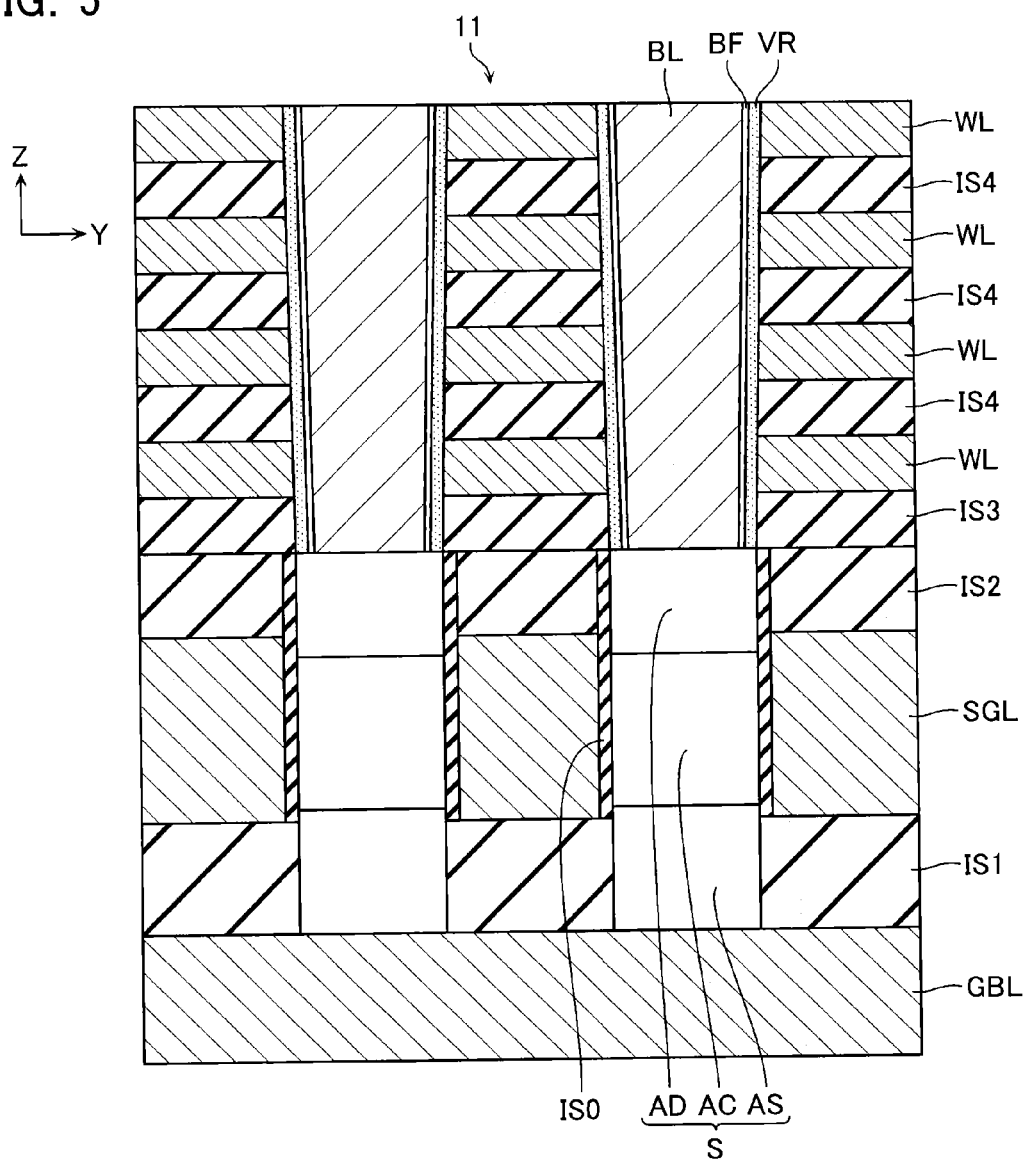
FIG. 5 is a Y-Z cross-sectional view showing the structure of the memory cell block in the semiconductor memory device according to the same embodiment.

FIG. 5 is a Y-Z cross-sectional view of the memory cell block 11.

The memory cell block 11 has, stacked sequentially in the Z direction on the semiconductor substrate not illustrated, a layer configured from the global bit line GBL extending in the Y direction, an interlayer insulating film IS1, a layer configured from the select gate line SGL extending in the X direction, an interlayer insulating film IS2, and an interlayer insulating film IS3. Moreover, layers configured from the word lines WL extending in the X direction are repeatedly stacked on the interlayer insulating film IS2, sandwiching an interlayer insulating film IS4 between each adjacent pair of the layers. In the case of FIG. 4, four layers configured from the word lines WL are stacked.

Formed in part of the interlayer insulating film IS1, the layer configured from the select gate line SGL, and the interlayer insulating film IS2 is the selection element S that has the source region AS, the channel region AC, and the drain region AD stacked from the layer configured from the global bit line GBL toward the interlayer insulating film IS3. Formed on the side surface facing the Y direction of the selection element S is the gate insulating film IS0. Note that as shown in FIG. 5, the select gate line SGL is formed such that its bottom surface is at a position lower than a boundary surface between the source region AS and the channel region AC of the selection element S and its top surface is at a position higher than a boundary surface between the channel region AC and the drain region AD of the selection element S.

Moreover, formed in part of the interlayer insulating film IS3, the layer configured from the word line WL, the interlayer insulating film IS4, . . . , the interlayer insulating film IS4, and the layer configured from the word line WL is the bit line BL which is column-shaped and extends in the Z direction. Formed sequentially on both side surfaces facing the Y direction of this bit line BL, from the bit line BL to the word line WL, are the block film BF and the variable resistance element VR. That is, the memory cell block 11 in the present embodiment has a structure where the bit line BL having polysilicon as a material and the variable resistance element VR having a transition metal oxide as a material are separated by the block film BF.

<Method of Manufacturing Memory Cell Block>

A method of manufacturing the memory cell block in the semiconductor memory device according to the first embodiment is described herein.

FIGS. 6 through 20 are views explaining the method of manufacturing the memory cell block 11.

Figure 6:
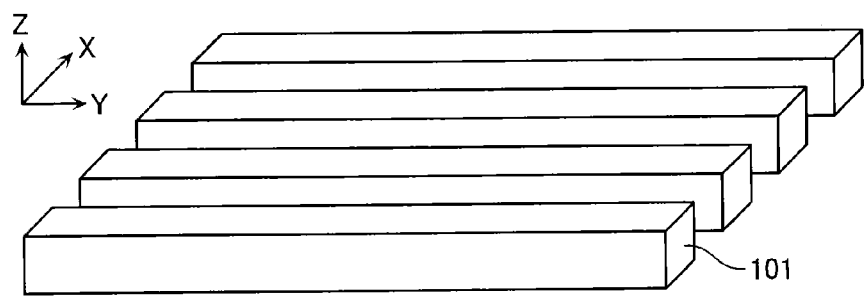
FIGS. 6 through 20 are views showing a method of manufacturing the memory cell block in the semiconductor memory device according to the same embodiment.

First, as shown in FIG. 6, a plurality of global bit lines 101 (GBL in FIG. 3) extending in the Y direction and aligned with a certain pitch in the X direction in the X-Y plane are formed on the semiconductor substrate, not illustrated, having as principal plane the X-Y plane. Employable as a material of the global bit lines 101 are, for example, tungsten (W), titanium nitride (TiN) acting as a barrier metal, and so on.

Figure 7:
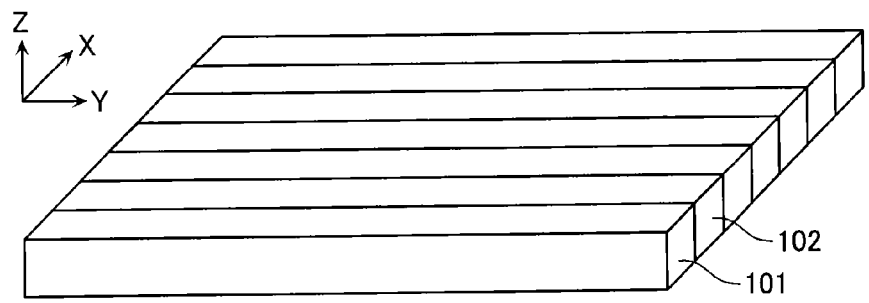

Next, as shown in FIG. 7, an insulating film 102 having for example silicon oxide ($SiO_2$) as a material is filled in between the plurality of global bit lines 101. Then, an upper surface of the insulating film 102 is polished by a CMP method or the like until upper surfaces of the global bit lines 101 are exposed.

Figure 8:
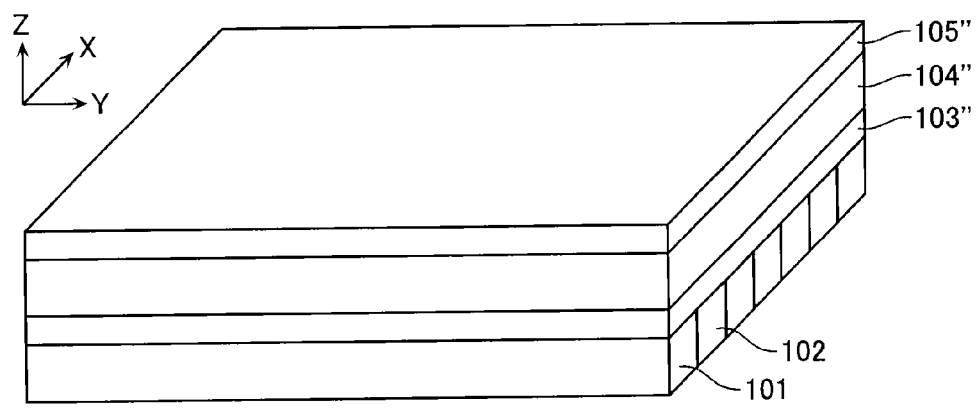

Subsequently, as shown in FIG. 8, a semiconductor film 103'' which is to become the source region AS, a semiconductor film 104'' which is to become the channel region AC, and a semiconductor film 105'' which is to become the drain region AD of the selection element S are stacked sequentially on the global bit lines 101 and the insulating film 102. Employable as a material of the semiconductor films 103'' and 105'' is, for example, N+ silicon having an impurity concentration of $1 \times 10^{20}$ cm$^{-3}$. Moreover, employable as a material of the semiconductor film 104'' is, for example, P+ silicon having an impurity concentration of $1 \times 10^{18}$ cm$^{-3}$. Then, the semiconductor films 103'' to 105'' are crystallized by annealing processing.

Figure 9:
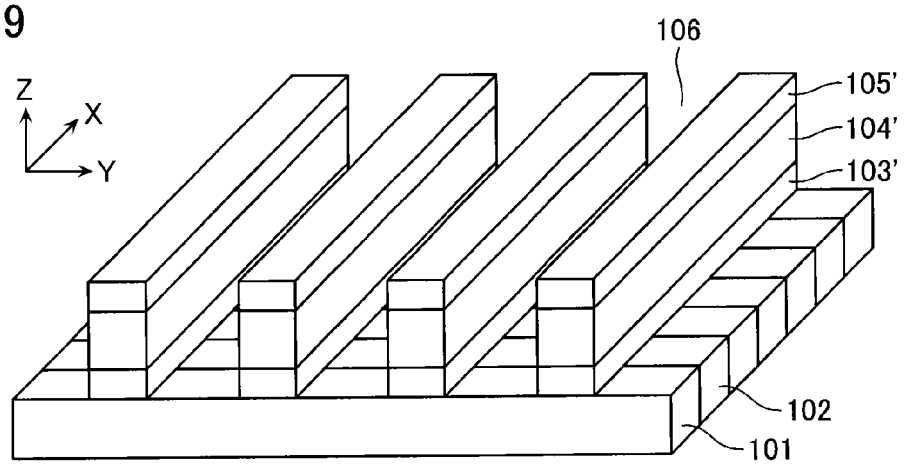

Next, as shown in FIG. 9, trenches 106 extending in the X direction are formed in the semiconductor films 103'' to 105'' by anisotropic etching. This results in semiconductor films 103' to 105' divided into a plurality in the Y direction being formed by the trenches 106.

Figure 10:
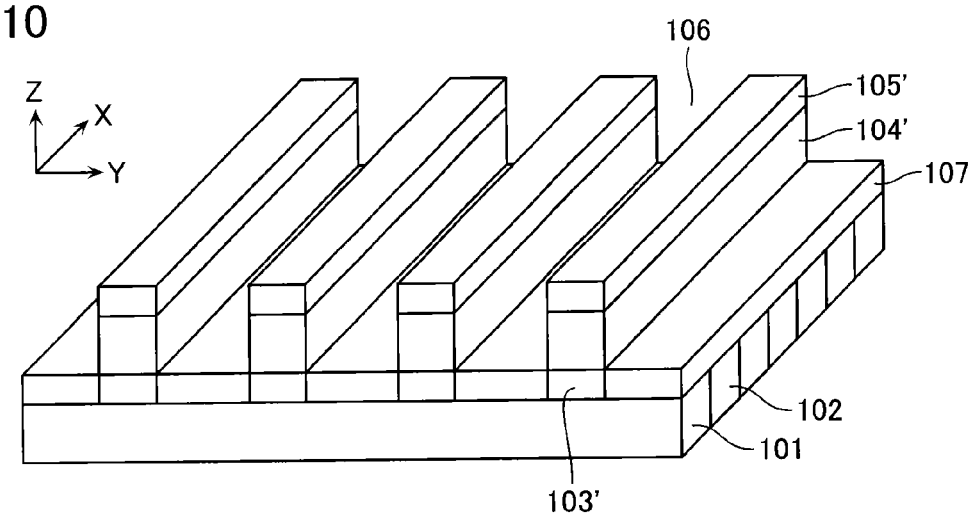

Subsequently, as shown in FIG. 10, an interlayer insulating film 107 which is to become the interlayer insulating film IS1 is filled into the trench 106. Employable as a material of the interlayer insulating film 107 is, for example, silicon oxide ($SiO_2$). Then, the interlayer insulating film 107 is etched back to be left only in a bottom portion of the trench 106.

Figure 11:
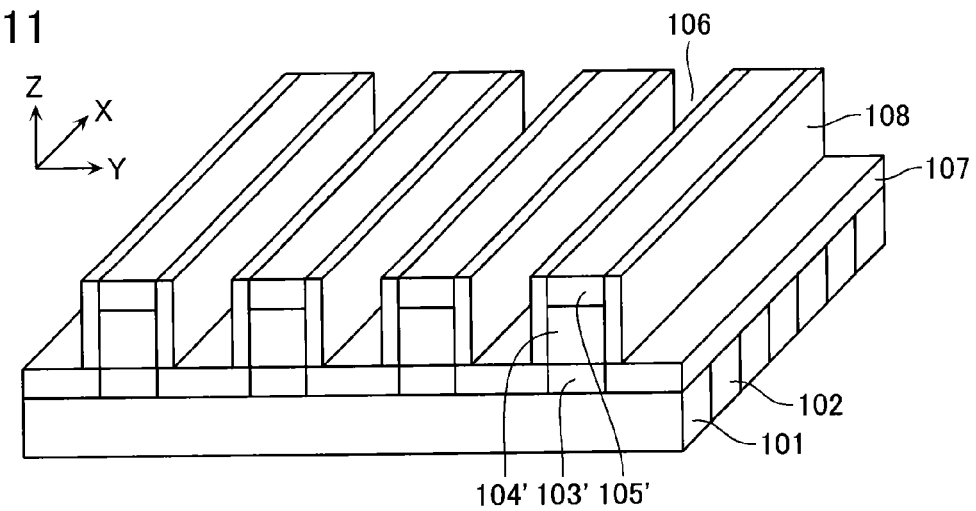

Next, as shown in FIG. 11, an insulating film 108 which is to become the gate insulating film IS0 of the selection element S is formed on a side wall of the trench 106. Employable as a material of the insulating film 108 is, for example, silicon oxide ($SiO_2$). Then, the insulating film 108 is partially removed by anisotropic etching until an upper surface of the semiconductor film 105' and an upper surface of the interlayer insulating film 107 are exposed. This results in the insulating film 108 being left only on the side wall of the trench 106.

Figure 12:
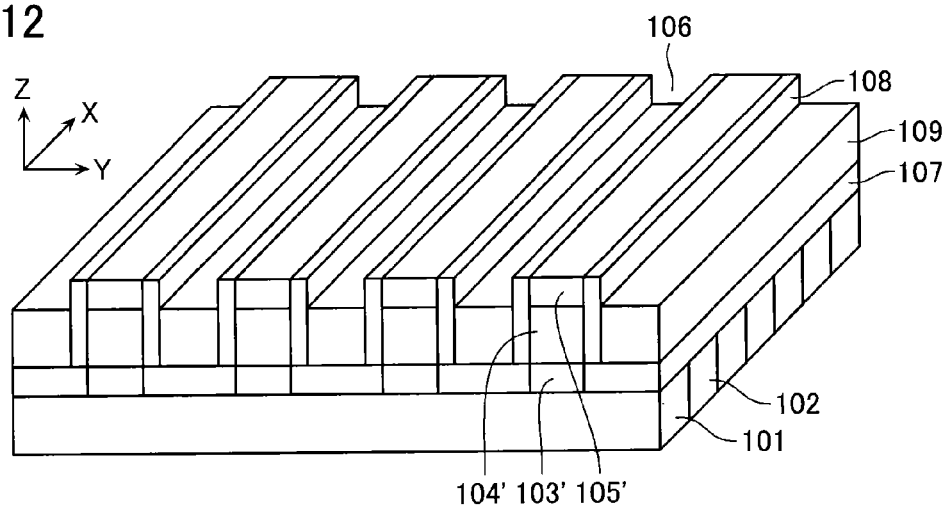

Subsequently, as shown in FIG. 12, a conductive film 109 which is to become the select gate line SGL of the trench 106 is formed in the trench 106. Employable as a material of the conductive film 109 is, for example, N+ polysilicon. Then, the conductive film 109 is formed such that a height of its bottom surface is lower than a boundary surface between the semiconductor films 103' and 104' and a height of its top surface is higher than a boundary surface between the semiconductor films 104' and 105'.

Figure 13:
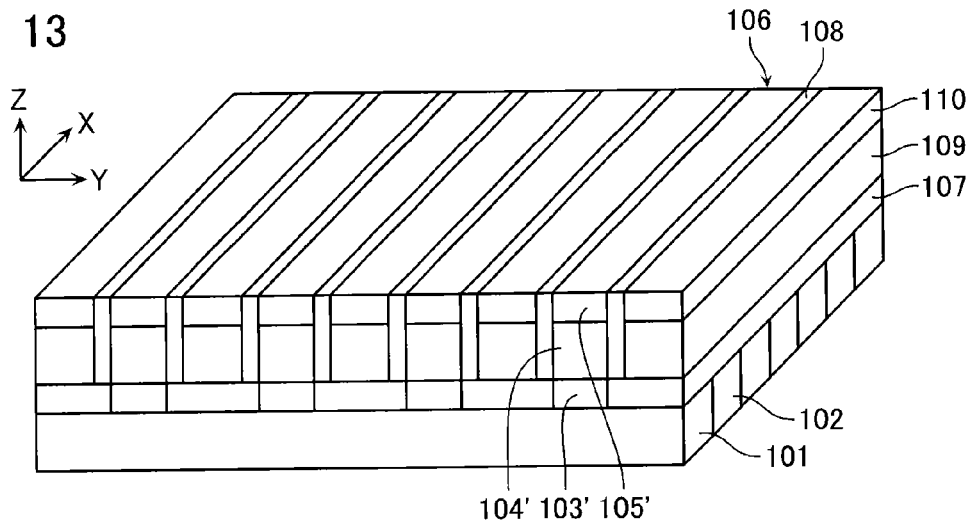

Next, as shown in FIG. 13, an interlayer insulating film 110 which is to become the interlayer insulating film IS2 is filled into the trench 106. Employable as a material of the interlayer insulating film 110 is, for example, silicon oxide ($SiO_2$). Then, an upper surface of the interlayer insulating film 110 is polished by a CMP method or the like until upper surfaces of the semiconductor film 105' and the insulating film 108 are exposed.

Figure 14:
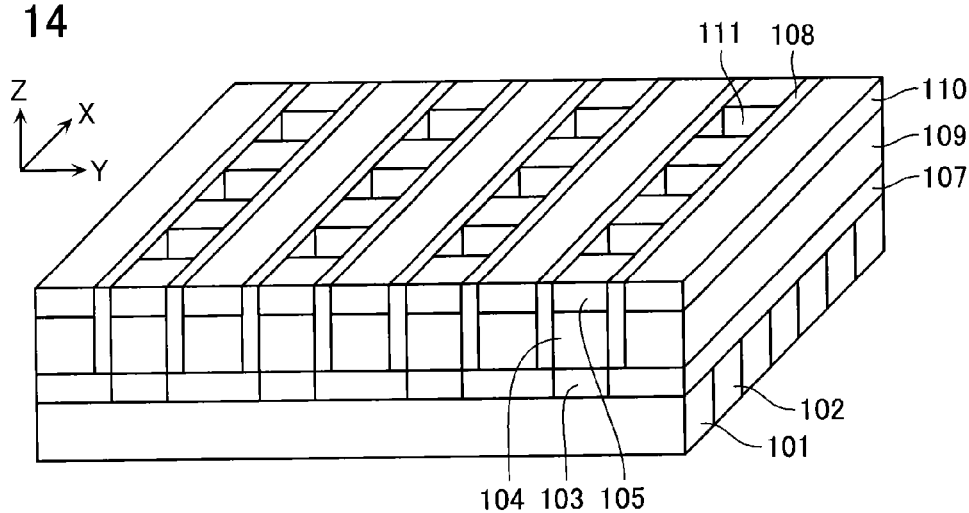

Subsequently, as shown in FIG. 14, column-shaped trenches 111 are formed in the semiconductor films 103' to 105' by anisotropic etching. The trench 111 herein is formed at a position where the insulating film 102 is present, as viewed from the Z direction. This results in the selection element S configured from the semiconductor films 103 to 105 being formed. Then, an insulating film 112 (not illustrated) having for example silicon oxide ($SiO_2$) as a material is filled into the trench 111.

Figure 15:
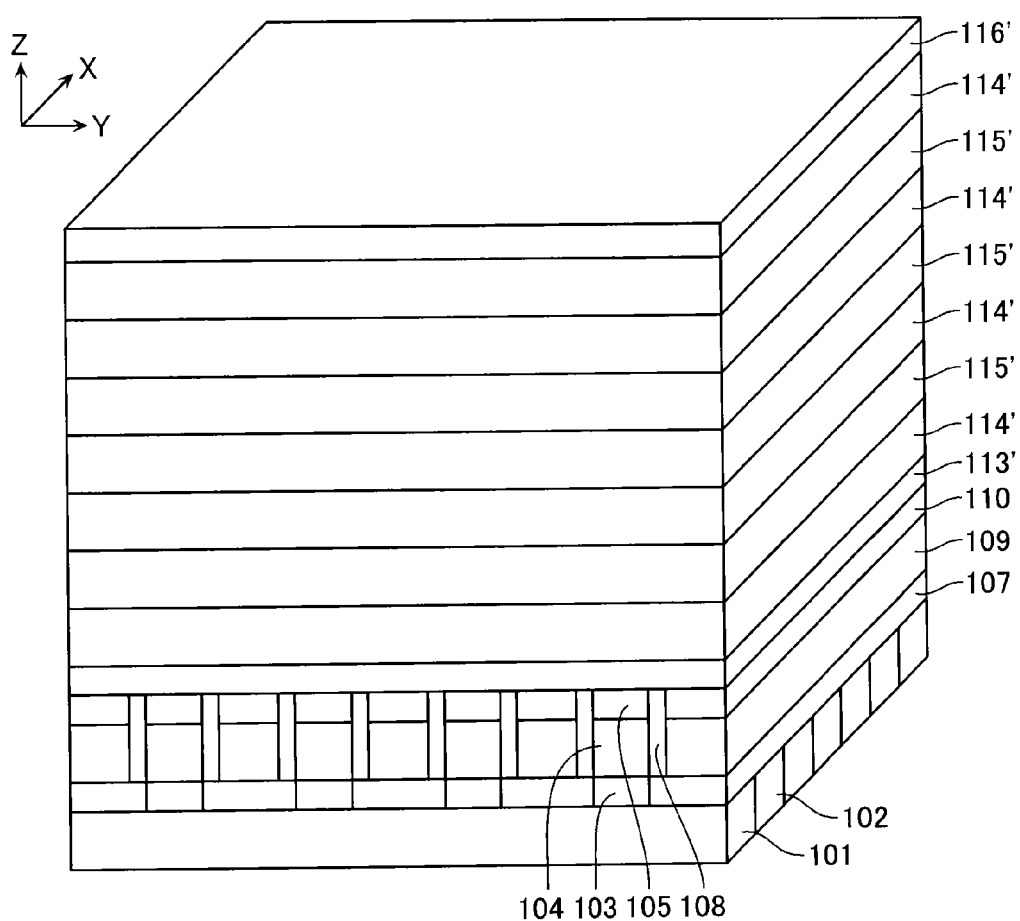

Next, as shown in FIG. 15, an interlayer insulating film 113' which is to become the interlayer insulating film IS3 is formed on the semiconductor film 105, the insulating film 108, the interlayer insulating film 110, and the insulating film 112. Employable as a material of the interlayer insulating film 113' is, for example, silicon oxide ($SiO_2$). Then, conductive films 114' which are to become the word lines WL are stacked repeatedly to a desired number on the interlayer insulating film 113', sandwiching an interlayer insulating film 115' which is to become the interlayer insulating film IS4 between each adjacent pair of the conductive films 114'. Employable as a material of the conductive film 114' are, for example, tungsten (W), titanium (Ti), tantalum (Ta), and their nitrides, or materials having these metals and nitrides stacked, and so on. Moreover, employable as a material of the interlayer insulating film 115' is, for example, silicon oxide ($SiO_2$). Then, an interlayer insulating film 116' having for example silicon oxide ($SiO_2$) as a material is stacked on an uppermost layer of the conductive films 114'.

Figure 16:
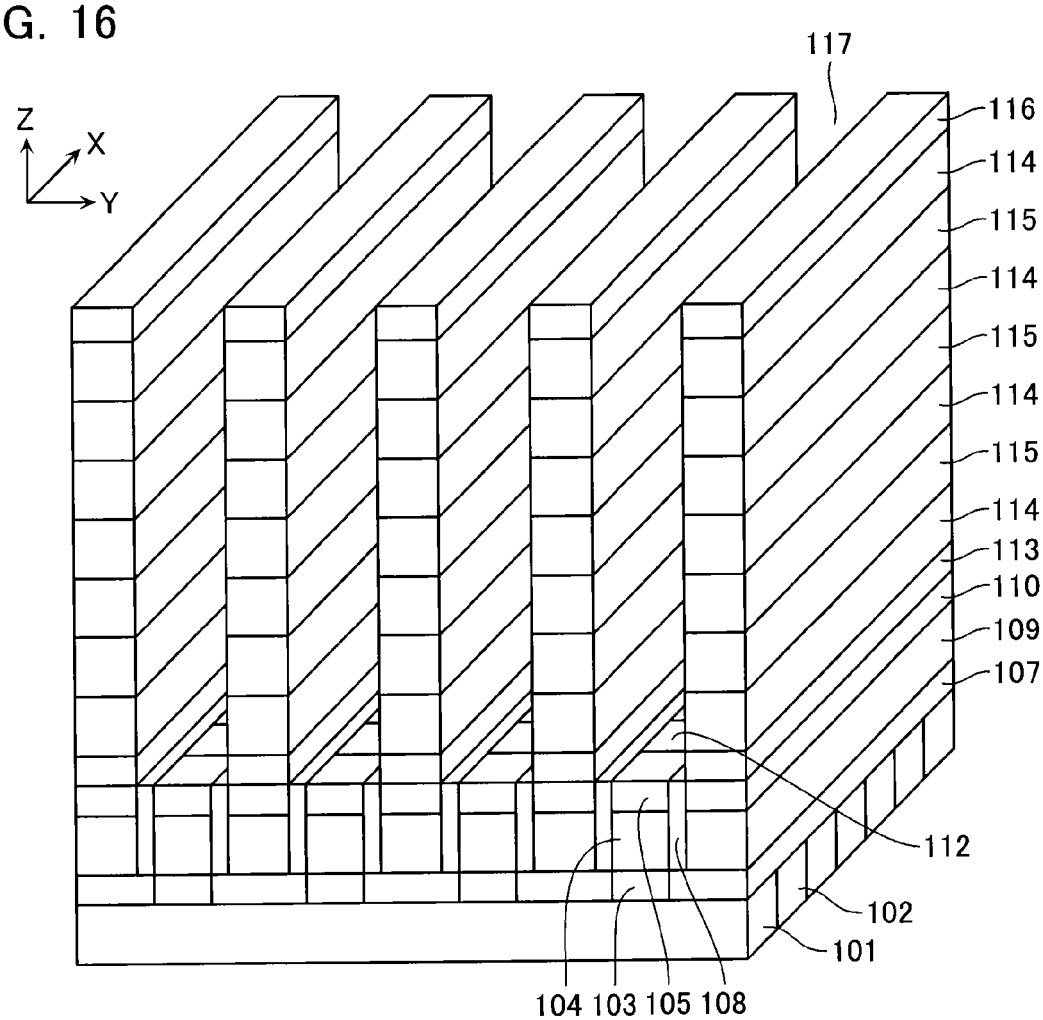

Subsequently, as shown in FIG. 16, trenches 117 extending in the X direction are formed from the interlayer insulating film 116' to the interlayer insulating film 113' by anisotropic etching. The trench 117 herein is formed at a position of the selection element S, as viewed from the Z direction. This results in the interlayer insulating film 113, the conductive films 114, and the interlayer insulating films 115 and 116 divided into a plurality in the Y direction being formed. Of these films, the conductive films 114 become the word lines WL. Moreover, the semiconductor film 105 and the insulating films 108 and 112 are exposed in a bottom portion of the trench 117.

Figure 17:
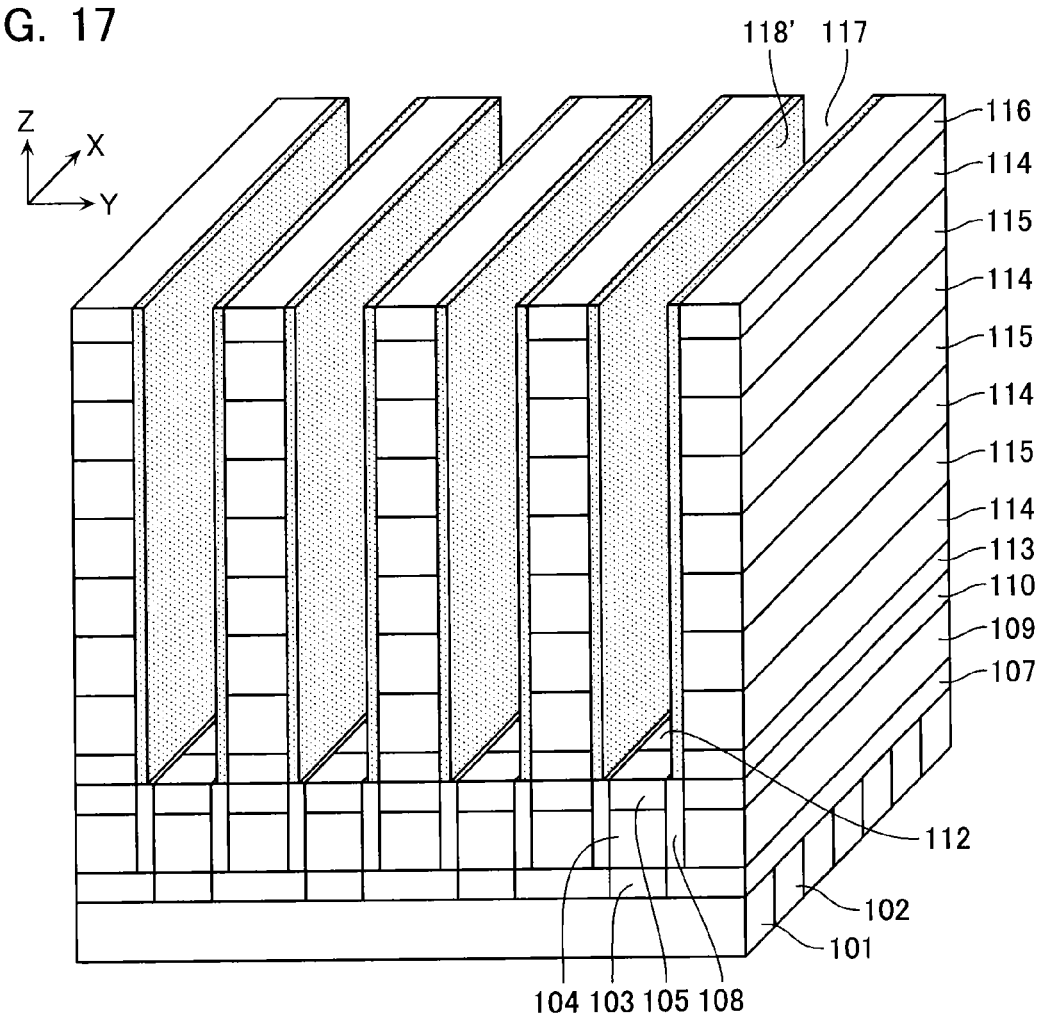

Next, as shown in FIG. 17, a resistance varying film 118' which is to become the variable resistance element VR is formed on the trench 117 and the interlayer insulating film 116 by an ALD method or the like. Employable as a material of the resistance varying film 118' is the above-described transition metal oxide. Then, the resistance varying film 118' is etched back to be left only on a side surface of the trench 117. This results in the semiconductor film 105 and the insulating films 108 and 112 being exposed again in the bottom portion of the trench 117. Note that this etching back may also be performed along with etching back of a block film 119' mentioned later.

Figure 18:
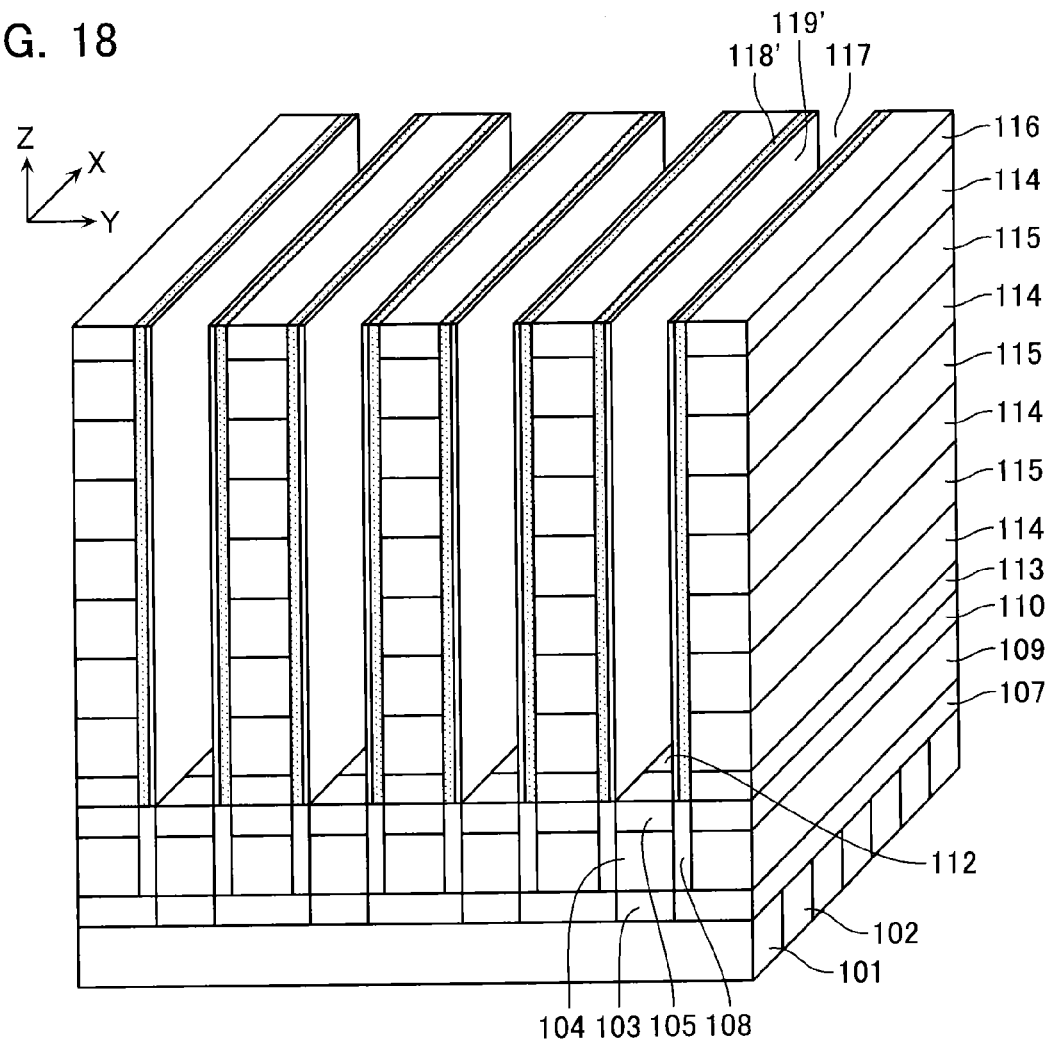

Subsequently, as shown in FIG. 18, the block film 119' which is to become the block film BF is formed on the trench 117 and the interlayer insulating film 116 by an ALD method or the like. Employable as a material of the block film 119' are silicon nitride (SiN), silicon oxynitride (SiON), and silicon oxide ($SiO_2$), or the like. In the case that silicon oxynitride is adopted as a material, the block film 119' may be formed by (i) forming a silicon oxide ($SiO_2$) film which is then nitridized, (ii) forming a silicon nitride (SiN) film which is then oxidized, (iii) forming a laminated film of ALD-$SiO_2$ and ALD-SiN, and so on. Then, the block film 119' is etched back to be left only on a side wall of the trench 117 where the resistance varying film 118' is formed.

Figure 19:
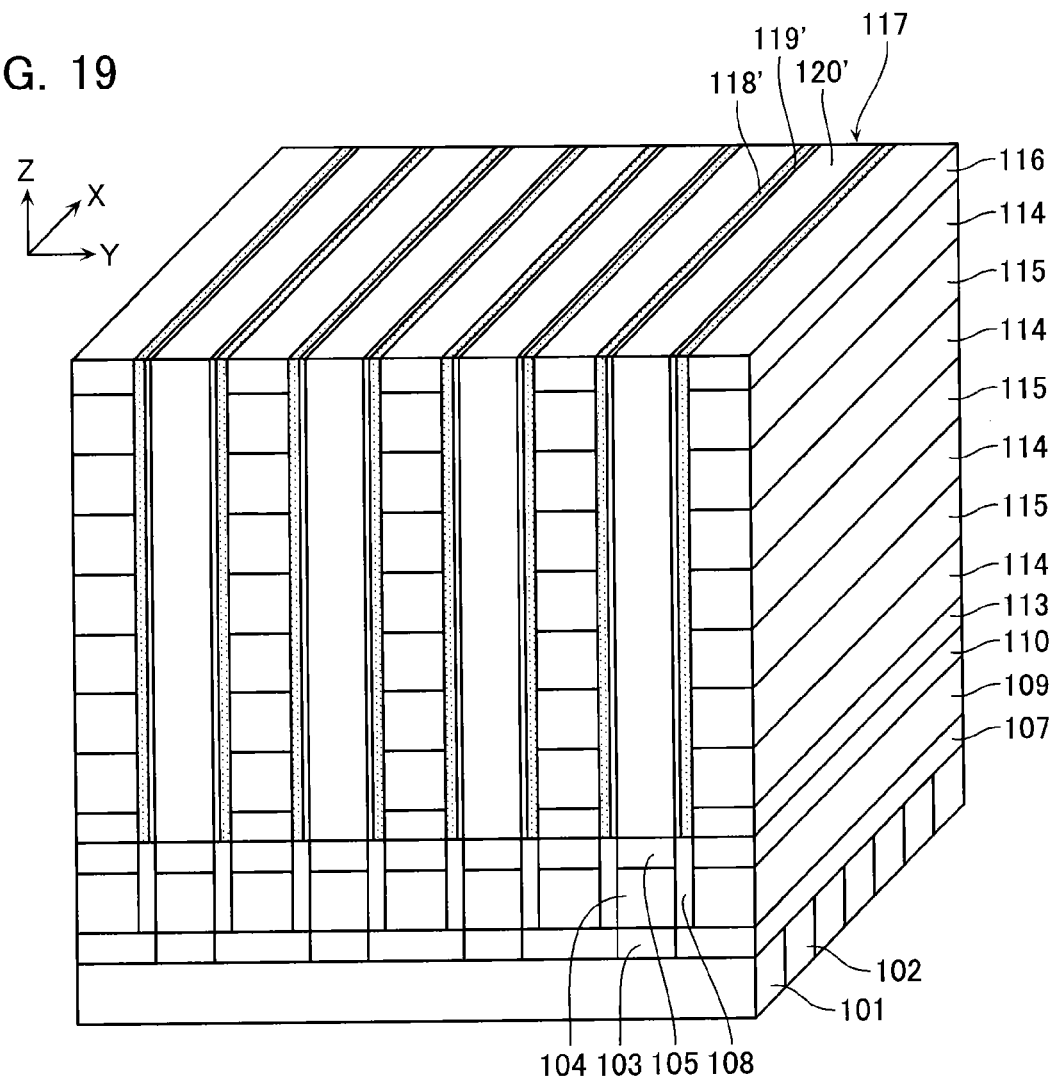

Next, as shown in FIG. 19, a polysilicon film 120' which is to become the bit lines BL is filled into the trenches 117. Then, an upper surface of the polysilicon film 120' is polished by a CMP method or the like until upper surfaces of the interlayer insulating film 116, the resistance varying film 118', and the block film 119' are exposed.

Figure 20:
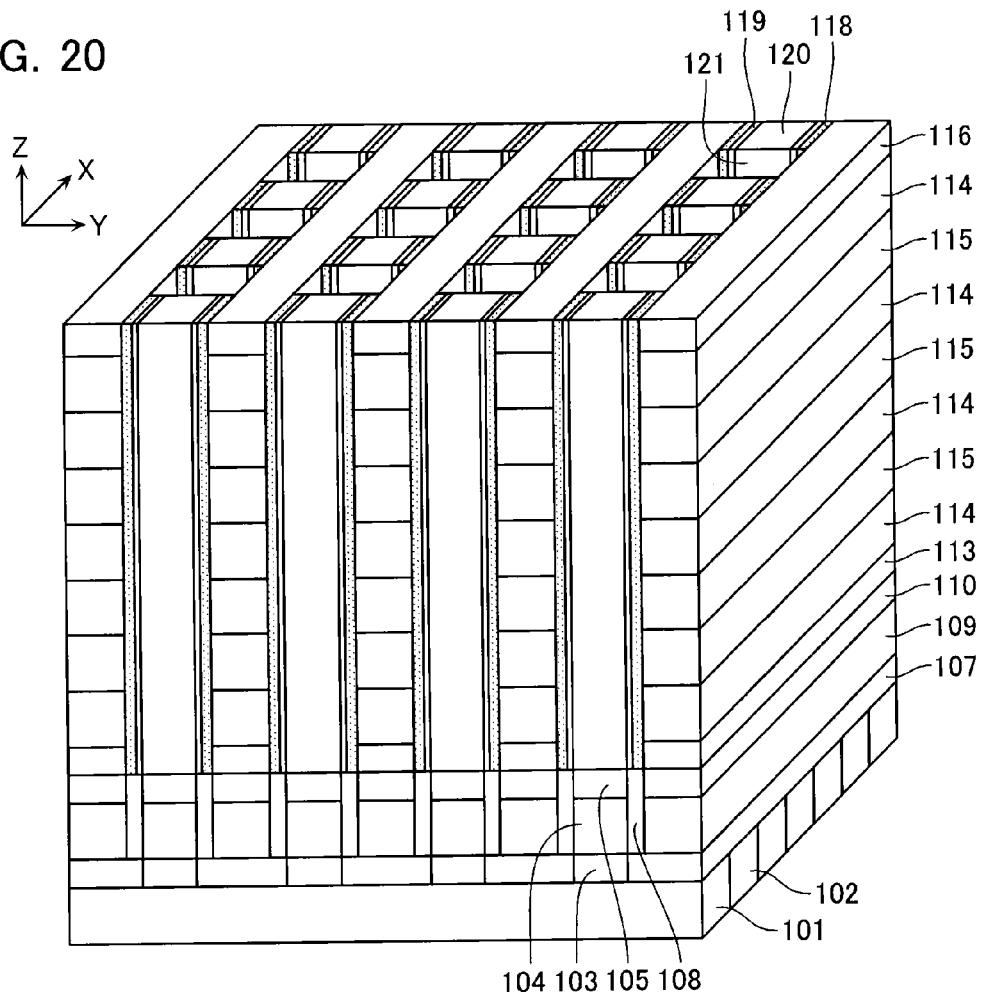

Subsequently, as shown in FIG. 20, column-shaped trenches 121 are formed in the resistance varying film 118', the block film 119', and the polysilicon film 120' by anisotropic etching. The trenches 121 herein are formed between the selection elements S adjacent in the X direction. In other words, the resistance varying film 118', the block film 119', and the polysilicon film 120' are left at a position where the selection element S is present, as viewed from the Z direction. This results in the resistance varying film 118, the block film 119, and the polysilicon film 120 divided into a plurality in the X direction being formed. These resistance varying film 118, block film 119, and polysilicon film 120 become, respectively, the variable resistance element VR, the block film BF, and the bit line BL. Moreover, as a result of processes up to this point, the memory cells MC configured from a variable resistance element VR and disposed at each of intersections of the plurality of word lines WL extending in the Y direction and the plurality of bit lines BL extending in the Z direction are formed. Note that here, isotropic etching may be used to form column-shaped trenches in the polysilicon film 120' only. This case results in the variable resistance elements VR and the block films BF in the memory cell block after completion being formed continuously between the bit lines BL adjacent in the X direction.

Finally, an insulating film 122 (not illustrated) having for example silicon oxide ($SiO_2$) as a material is filled into the trenches 121.

The above-described processes enable the memory cell block 11 to be manufactured.

<Summary>

Advantages of the present invention are described herein by taking as a comparative example the case where there is no block film BF between the variable resistance element VR and the bit line BL.

In the case of the comparative example, the bit line BL and the variable resistance element VR are in direct contact, hence silicon in the polysilicon which is the material of the bit line BL and a transition metal oxide which is the material of the variable resistance element VR react to form silicide near a boundary of the bit line BL and the variable resistance element VR.

In this regard, in the case of the present embodiment, the block film BF is provided between the bit line BL and the variable resistance element VR, hence formation of silicide near a boundary of the bit line BL and the variable resistance element VR can be suppressed compared to the comparative example.

Figure 21A:
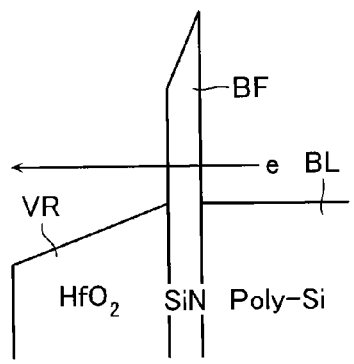
FIG. 21A is a view showing a condition of a potential barrier between a variable resistance element and a bit line in the semiconductor memory device according to the same embodiment.
Figure 21B:
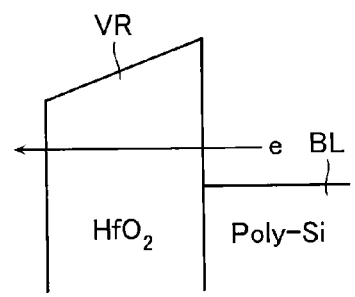
FIG. 21B is a view showing a condition of a potential barrier between a variable resistance element and a bit line in a semiconductor memory device according to a comparative example of the same embodiment.

FIG. 21A and FIG. 21B are views showing a condition of a potential barrier between the variable resistance element VR (resistance varying film 118) and the bit line BL (conductive film 120), FIG. 21A showing the case of the present embodiment and FIG. 21B showing the case of the comparative example.

In the case of the comparative example, as shown in FIG. 21B, there is a problem that a potential barrier of the hafnium oxide ($HfO_2$) which is the material of the variable resistance element VR is large, hence it is proportionately more difficult for a tunnel current to flow.

In this regard, in the case of the present embodiment, as shown in FIG. 21A, providing the block film BF having for example silicon nitride (SiN) as a material enables a potential barrier of the variable resistance element VR having for example hafnium oxide ($HfO_2$) as a material to be lowered. As a result, it becomes more easy for a tunnel current to flow, hence an operation voltage of the memory cells MC can be proportionately reduced compared to the comparative example. In other words, voltages applied to the memory cells MC in a forming operation, setting operation, and resetting operation can be reduced, whereby power consumption can be proportionately suppressed.

Figure 22:
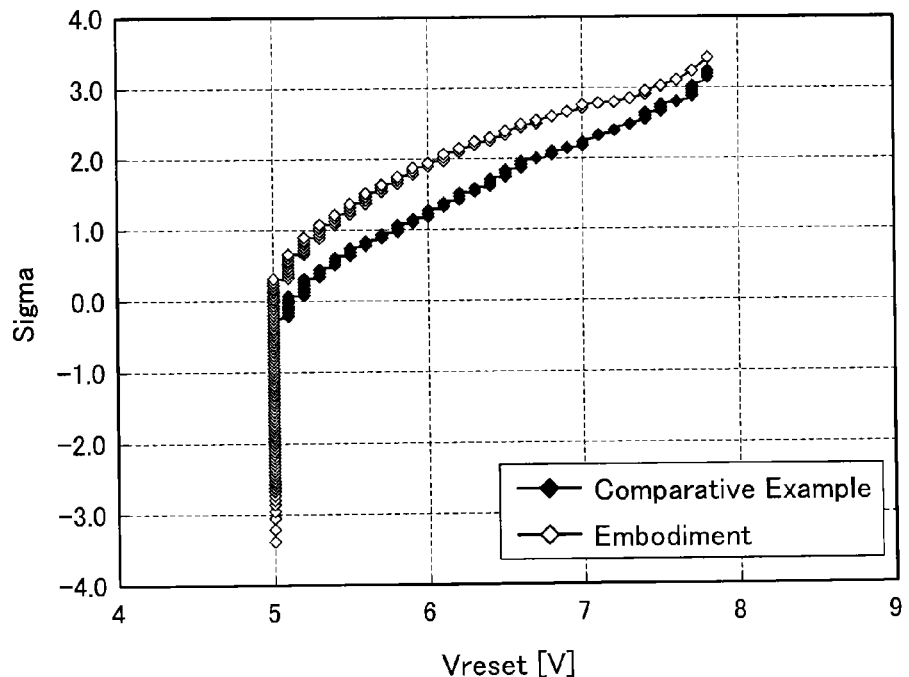
FIG. 22 is a view explaining advantages of the semiconductor memory device according to the same embodiment.
Figure 23:
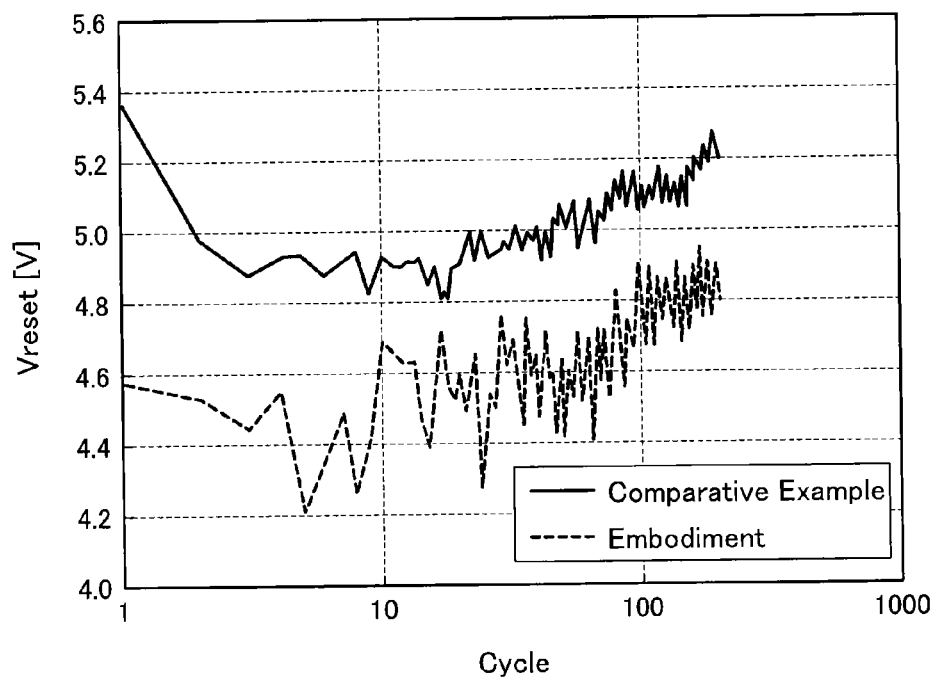
FIG. 23 is a view explaining advantages of the semiconductor memory device according to the same embodiment.

FIG. 22 is a graph showing a relationship between a resetting voltage applied to memory cells during a resetting operation and a proportion of the memory cells for which this voltage caused the resetting operation to be completed. In this FIG. 22, white diamond shapes are for the case of the present embodiment and black diamond shapes are for the case of the comparative example. In addition, FIG. 23 is a graph showing a relationship between the number of times (cycles) that the resetting operation is repeated and the resetting voltage at which the resetting operation of the memory cells is completed. In this FIG. 23, the broken line is for the case of the present embodiment and the solid line is for the case of the comparative example.

As is clear from FIG. 22, it may be understood that in the case of the present embodiment, there is a higher proportion of memory cells for which the resetting operation is completed at a lower resetting voltage than in the comparative example.

In addition, as is clear from FIG. 23, it may be understood that in the case of the present embodiment, overall, the resetting operation of the memory cells is completed at a lower resetting voltage than in the comparative example, regardless of the number of times that the resetting operation is repeated.

As is clear from the above, in the case of the present embodiment, providing the block film BF between the variable resistance element VR having a transition metal oxide as a material and the bit line having polysilicon as a material enables reaction between the transition metal oxide and the polysilicon to be suppressed. Moreover, since the potential barrier of the transition metal oxide in the variable resistance element VR is lowered, an operation voltage of the memory cells can be proportionately reduced. In other words, the present embodiment allows a semiconductor memory device of low power consumption to be provided.

Second Embodiment

In the first embodiment, a semiconductor memory device having the word lines WL formed by conductive films and the bit lines BL formed by polysilicon films was described. In contrast, in the second embodiment, a semiconductor memory device having the word lines WL formed by polysilicon films and the bit lines BL formed by conductive films is described. In other words, in the second embodiment, the word lines WL correspond to the polysilicon wiring lines. Note that description of the present embodiment focuses on differences with the first embodiment.

First, a structure of a memory cell block 21 according to the present embodiment is described.

Figure 24:
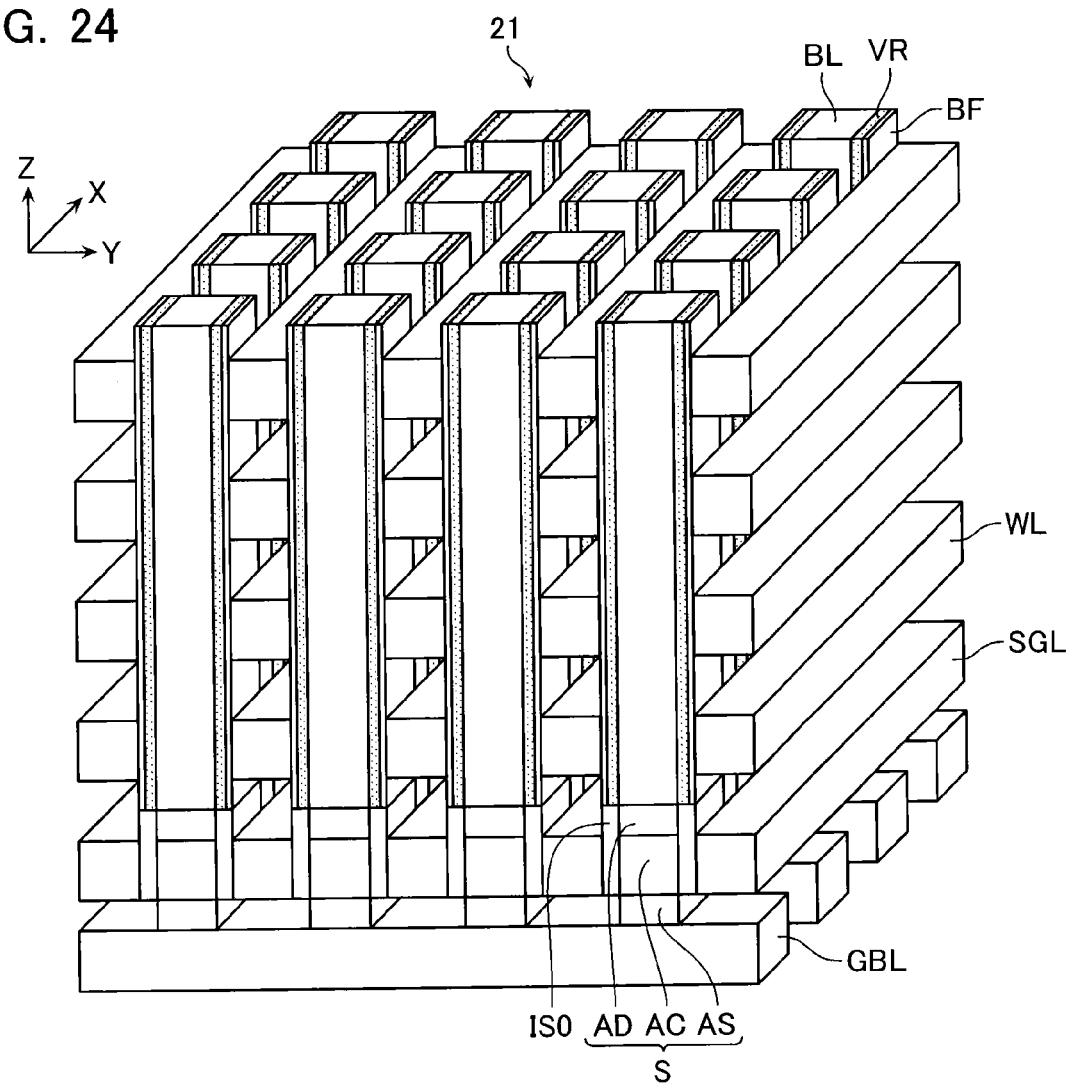
FIG. 24 is a perspective view showing a structure of a memory cell block in a semiconductor memory device according to a second embodiment.
Figure 25:
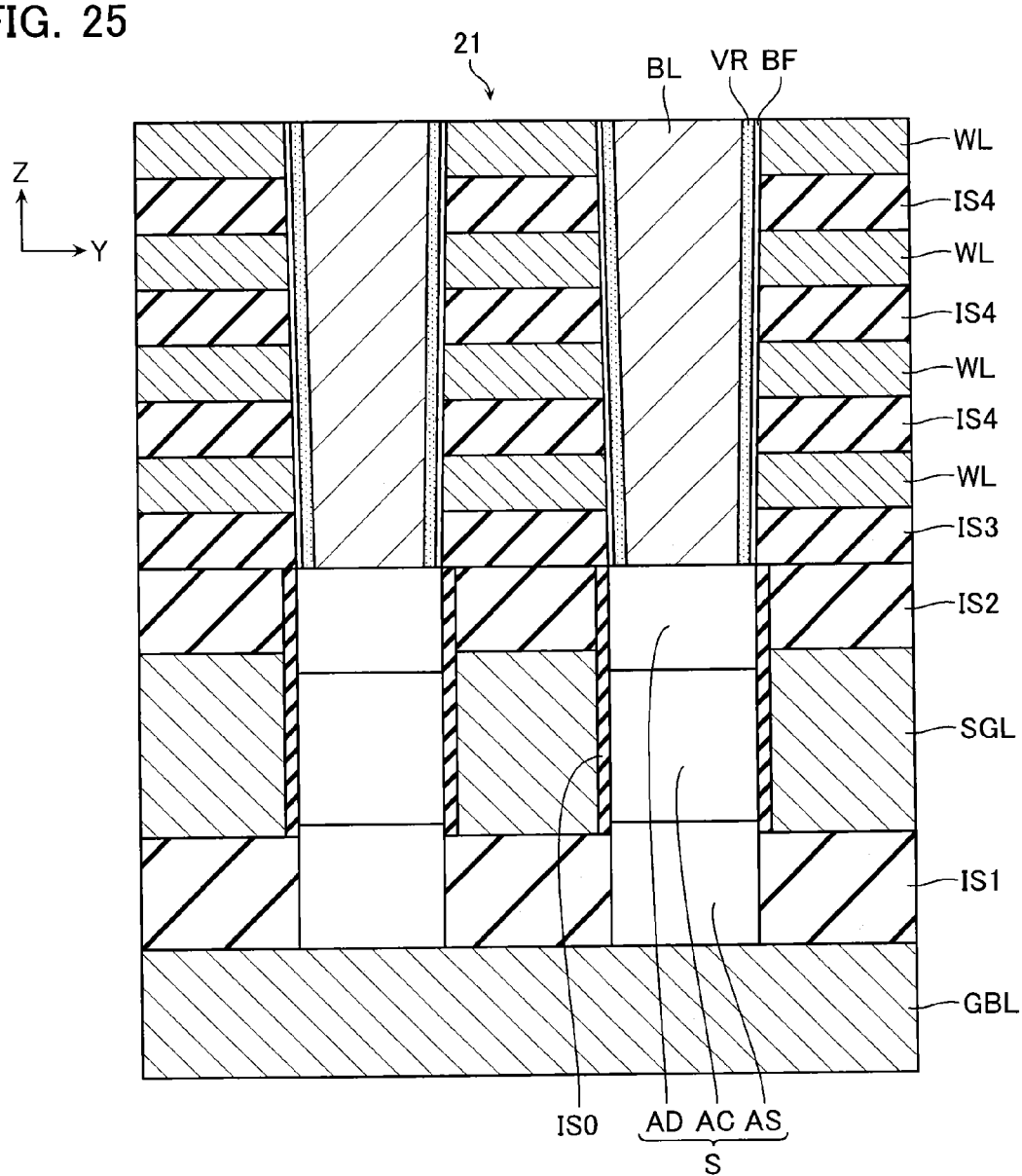
FIG. 25 is a Y-Z cross-sectional view showing the structure of the memory cell block in the semiconductor memory device according to the same embodiment.

FIG. 24 is a perspective view showing part of the memory cell block 21, and FIG. 25 is a Y-Z cross-sectional view of the memory cell block 21.

The memory cell block 21 has the word lines WL formed by polysilicon and the bit lines BL formed by a material having high heat resistance and a low resistance value, for example, tungsten (W), or the like. Therefore, the block film BF is formed not between the bit line BL and the variable resistance element VR as in the first embodiment, but between the word line WL and the variable resistance element VR.

Next, a method of manufacturing the memory cell block 21 is described.

Figure 26:
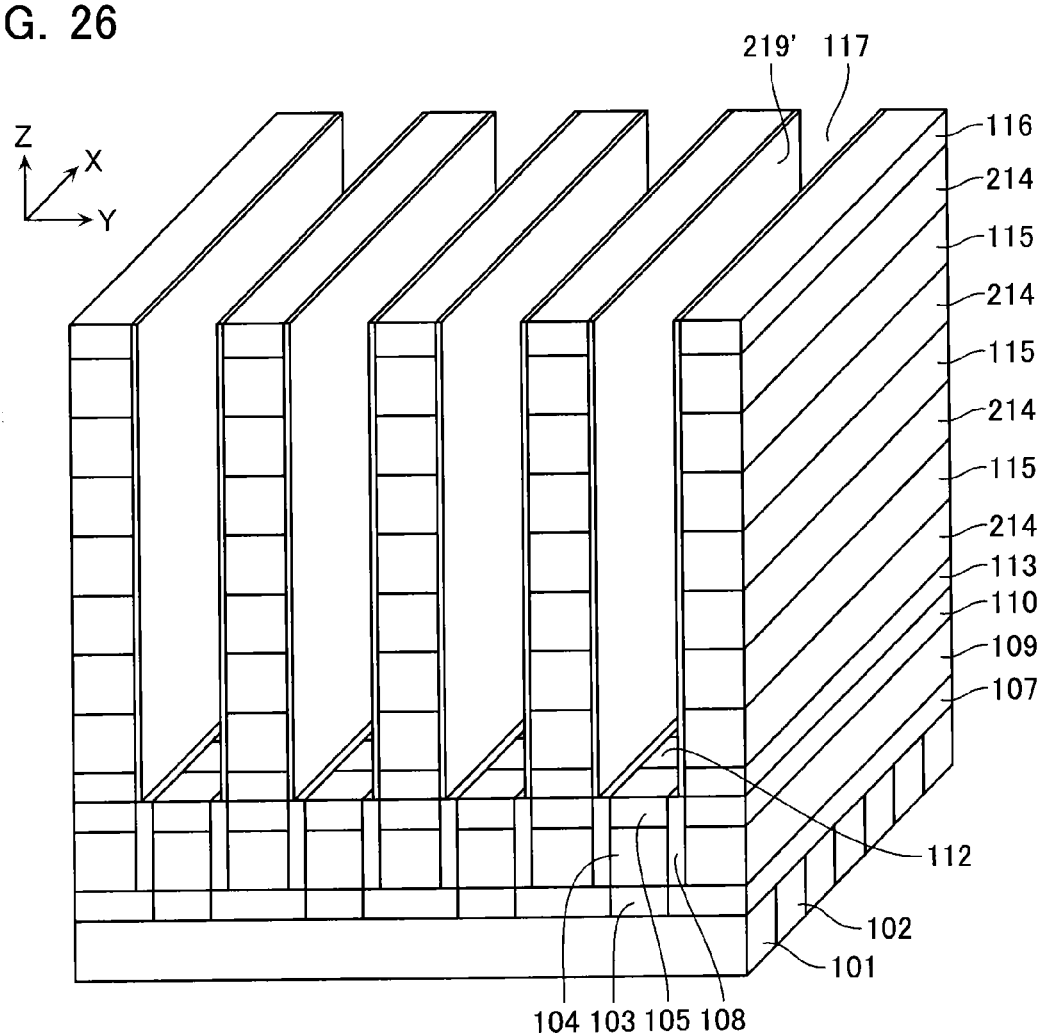
FIG. 26 is a view showing a method of manufacturing the memory cell block in the semiconductor memory device according to the same embodiment.
Figure 27:
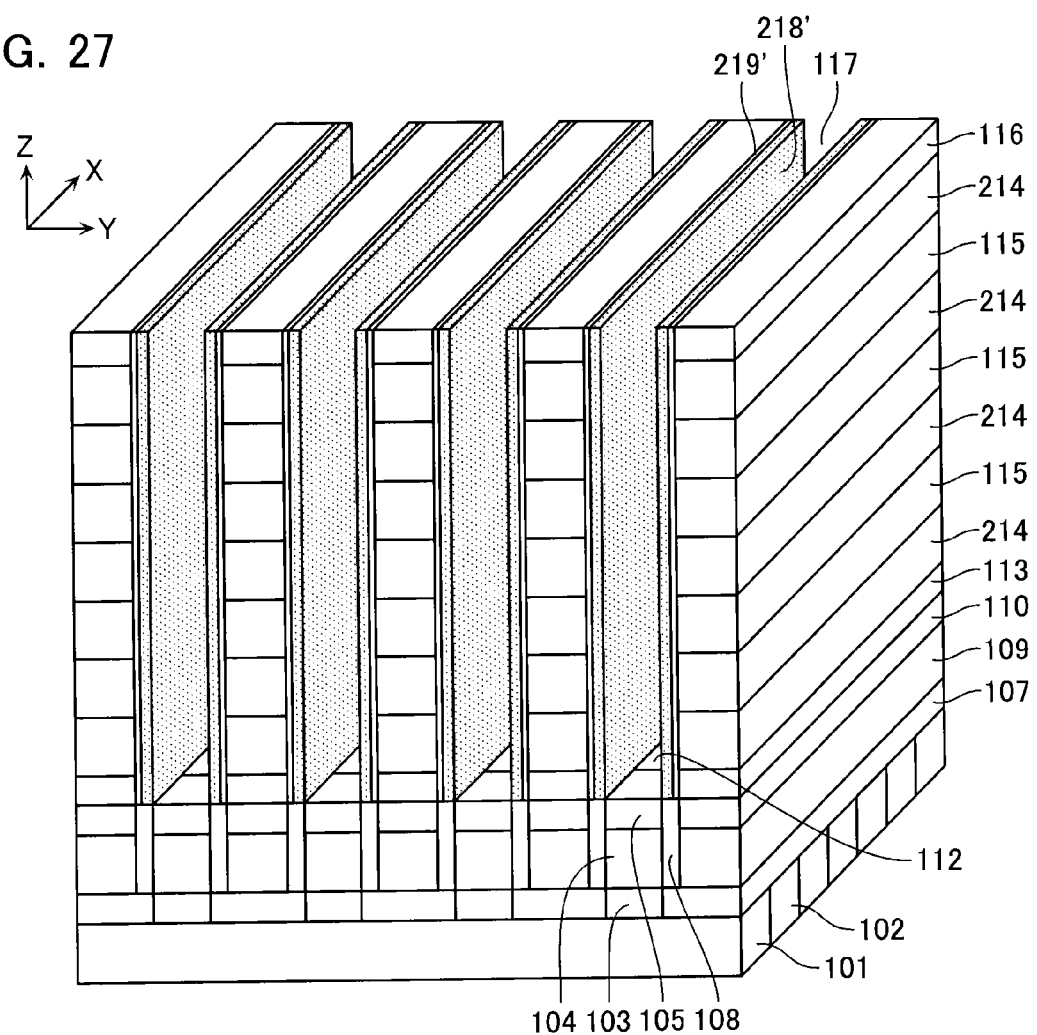
FIG. 27 is a view showing the method of manufacturing the memory cell block in the semiconductor memory device according to the same embodiment.

FIG. 26 and FIG. 27 are views explaining the method of manufacturing the memory cell block 21. Note that in the description of the present embodiment and FIG. 26 and FIG. 27, configurations in common with the first embodiment are assigned the same reference numerals as those used in the first embodiment.

Initial processes from formation of the global bit lines 101 to formation of the trenches 117 are similar to the processes described using FIG. 6 to FIG. 16 in the first embodiment, hence description of those processes is omitted. Note that in the present embodiment, polysilicon films 214 are employed in place of the conductive films 114.

Next, as shown in FIG. 26, a block film 219' which is to become the block film BF is formed on the trench 117 and the interlayer insulating film 116 by an ALD method or the like. Employable as a material of the block film 219' are silicon nitride (SiN), silicon oxynitride (SiON), and silicon oxide ($SiO_2$), or the like. In the case that silicon oxynitride is adopted as a material, the block film 219' may be formed by (i) forming a silicon oxide ($SiO_2$) film which is then nitridized, (ii) forming a silicon nitride (SiN) film which is then oxidized, (iii) forming a laminated film of ALD-$SiO_2$ and ALD-SiN, and so on, similarly to in the first embodiment.

Moreover, in the case of the present embodiment, the polysilicon films 214 and the interlayer insulating films 115 are exposed on a side wall of the trench 117. Therefore, the block film 219' may also be formed by oxidizing and nitridizing N+ polysilicon which is the material of the polysilicon film 214 and silicon oxide ($SiO_2$) which is the material of the interlayer insulating film 215 exposed on the side wall of the trench 117. In this case, manufacturing of the memory cell block 21 by fewer processes than in the above-described methods (i) to (iii) is possible.

Then, the block film 219' is etched back to be left only on the side wall of the trench 117. This results in the semiconductor film 105 and the insulating films 108 and 112 being exposed in the bottom portion of the trench 117. Note that this etching back may also be performed along with etching back of a resistance varying film 218' mentioned later.

Subsequently, as shown in FIG. 27, the resistance varying film 218' which is to become the variable resistance element VR is formed on the trench 117 and the interlayer insulating film 116 by an ALD method or the like. Employable as a material of the resistance varying film 218' is the above-described transition metal oxide. Then, the resistance varying film 218' is etched back to be left only on the side wall of the trench 117 where the block film 219' is formed. This results in the semiconductor film 105 and the insulating film 112 being exposed again in the bottom portion of the trench 117.

Then, the memory cell block 21 can be manufactured by executing similar processes to the processes described using FIG. 18 to FIG. 20 in the first embodiment. Note that in the present embodiment, conductive films having for example tungsten (W) as a material may be employed in place of the polysilicon films 120.

As described above, the present embodiment provides the block film BF between the variable resistance element VR having the transition metal oxide as a material and the word line WL having polysilicon as a material, and hence enables similar advantages to those in the first embodiment to be obtained.

Other

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising, in the case that three mutually intersecting directions are assumed to be an X direction, a Y direction, and a Z direction:
   a semiconductor substrate having as principal plane a plane extending in the X direction and the Y direction; and
   a memory cell block formed on the semiconductor substrate and configured having a plurality of memory cell arrays aligned in the Y direction, each of the memory cell arrays including a plurality of column lines extending in the Z direction and arranged in the X direction, a plurality of row lines extending in the X direction and arranged in the Z direction, and a plurality of memory cells disposed at each of intersections of the plurality of column lines and the plurality of row lines,
   each of the memory cells including a variable resistance element having a transition metal oxide as a material,
   at least one of the plurality of column lines and the plurality of row lines being a polysilicon wiring line having polysilicon as a material,
   the memory cell block including a block film between the variable resistance element of the memory cell and the polysilicon wiring line, and
   the block film configured from silicon nitride, silicon oxynitride, or silicon oxide.

2. The semiconductor memory device according to claim 1, wherein
   the variable resistance element and the block film are formed continuously between the plurality of row lines arranged in the Z direction.

3. The semiconductor memory device according to claim 1, wherein
   the variable resistance element is configured from hafnium oxide.

4. The semiconductor memory device according to claim 1, wherein
   two of the memory cell arrays adjacent in the Y direction share the plurality of column lines or the plurality of row lines.

5. A semiconductor memory device, comprising, in the case that three mutually intersecting directions are assumed to be an X direction, a Y direction, and a Z direction:
   a semiconductor substrate having as principal plane a plane extending in the X direction and the Y direction; and
   a memory cell block formed on the semiconductor substrate and configured having a plurality of memory cell arrays aligned in the Y direction, each of the memory cell arrays including a plurality of column lines extending in the Z direction and arranged in the X direction, a plurality of row lines extending in the X direction and arranged in the Z direction, and a plurality of memory cells disposed at each of intersections of the plurality of column lines and the plurality of row lines,
   each of the memory cells including a variable resistance element having a transition metal oxide as a material,
   at least one of the plurality of column lines and the plurality of row lines being a polysilicon wiring line having polysilicon as a material,
   the memory cell block including a block film between the variable resistance element of the memory cell and the polysilicon wiring line,
   the memory cell block including selection elements formed at each of one ends of the plurality of column lines, and a plurality of global column lines extending in the Y direction and arranged in the X direction, and
   a plurality of the column lines aligned in the Y direction being each connected to one of the global column lines via the respective selection elements.

6. The semiconductor memory device according to claim 5, wherein
   the memory cell block includes a plurality of selection element control wiring lines extending in the X direction and arranged in the Y direction, and
   a plurality of the control elements aligned in the X direction are commonly controlled by one of the selection element control wiring lines.

7. The semiconductor memory device according to claim 5, wherein
   the plurality of selection elements each includes, stacked sequentially in the Z direction from the global column lines to the column lines, a source region configured from a first conductivity type semiconductor, a channel region configured from a second conductivity type semiconductor, and a drain region configured from the first conductivity type semiconductor.

8. A semiconductor memory device, comprising, in the case that three mutually intersecting directions are assumed to be an X direction, a Y direction, and a Z direction:
   a semiconductor substrate having as principal plane a plane extending in the X direction and the Y direction; and
   a memory cell block formed on the semiconductor substrate and configured having a plurality of memory cell arrays aligned in the Y direction, each of the memory cell arrays including a plurality of column lines extending in the Z direction and arranged in the X direction, a plurality of row lines extending in the X direction and arranged in the Z direction, and a plurality of memory cells disposed at each of intersections of the plurality of column lines and the plurality of row lines,
   each of the memory cells including a variable resistance element having a transition metal oxide as a material,
   at least one of the plurality of column lines and the plurality of row lines being a polysilicon wiring line having polysilicon as a material,
   the memory cell block including a block film between the variable resistance element of the memory cell and the polysilicon wiring line, and
   a plurality of even-numbered ones of the row lines aligned in the Y direction being commonly connected, and a plurality of odd-numbered ones of the row lines aligned in the Y direction being commonly connected.

* * * * *